United States Patent
Ikegami (10) Patent No.: US 6,653,171 B2
(45) Date of Patent: Nov. 25, 2003

(54) FLIP-CHIP TYPE SEMICONDUCTOR DEVICE HAVING SPLIT VOIDS WITHIN UNDER-FILL LAYER AND ITS MANUFACTURING METHOD

(75) Inventor: Gorou Ikegami, Shiga (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/904,167

(22) Filed: Jul. 12, 2001

(65) Prior Publication Data
US 2002/0048848 A1 Apr. 25, 2002

(30) Foreign Application Priority Data
Jul. 25, 2000 (JP) .......................... 2000-223207

(51) Int. Cl.[7] .................. H01L 21/44; H01L 21/50
(52) U.S. Cl. .......................... 438/120; 438/127
(58) Field of Search ............................... 438/108, 118, 438/120, 127

(56) References Cited

U.S. PATENT DOCUMENTS

| 5,545,589 A | * | 8/1996 | Tomura et al. | 437/183 |
| 6,313,533 B1 | * | 11/2001 | Funaya et al. | 257/737 |
| 6,406,990 B1 | * | 6/2002 | Kawai | 438/612 |

FOREIGN PATENT DOCUMENTS

| JP | 06-029334 | 2/1994 |
| JP | 10-335373 | 12/1998 |

* cited by examiner

Primary Examiner—Amir Zarabian
Assistant Examiner—Pamela E Perkins
(74) Attorney, Agent, or Firm—Katten Muchin Zavis Rosenman (57) ABSTRACT

In a flip-chip type semiconductor device including a semiconductor chip having metal bumps on one surface thereof, an interposer substrate having pad electrodes on one surface thereof, and an under-fill resin layer filled into a gap between the semiconductor chip and the interposer substrate where the metal bumps are in contact with the pad electrodes, the under-fill resin layer has a number of split voids therein.

5 Claims, 12 Drawing Sheets

FLIP-CHIP TYPE SEMICONDUCTOR DEVICE HAVING SPLIT VOIDS WITHIN UNDER-FILL LAYER AND ITS MANUFACTURING METHOD

BACKGROUND OF THE INVENTION

1. Field of the Invention

The present invention relates to a flip-chip semiconductor device and its manufacturing method.

2. Description of the Related Art

In a first prior art method for manufacturing a flip-chip type semiconductor device (see: JP-A-6-29334), first, a flip-chip type semiconductor chip having metal bumps is faced down and then is mounted on an interposer substrate having pad electrodes, so that the metal bumps are in contact with respective ones of the pad electrodes. Next, thermosetting resin including silica or alumina is injected into a gap between the semiconductor chip and the interposer substrate, so that an under-fill resin layer is formed therebetween. Next, the interposer substrate is subjected to ultrasonic vibration, in order to eliminate voids from the under-fill resin layer. Finally, a heating operation is performed upon the under-fill resin layer, so that the under-fill resin layer is hardened. This will be explained later in detail.

In the above-described first prior art method, however, since under-fill resin is injected into a gap after such a gap is formed between the semiconductor chip and the interposer substrate, it is difficult to completely inject under-fill resin into the gap due to the fact that the gap is very narrow.

In a second prior art method for manufacturing a flip-chip type semiconductor device (see: JP-A-10-335373), first, thermosetting resin including silica or alumina is coated on an interposer substrate having pad electrodes, so that an under-fill resin layer is formed thereon. Next, a flip-chip type semiconductor chip having metal bumps is faced down and then is mounted on the interposer substrate, so that the metal bumps are in contact with respective ones of the pad electrodes. Next, the semiconductor chip is subjected to ultrasonic vibration, so that a solid-phase diffusion occurs at the contact portions between the metal bumps and the pad electrodes. Finally, a heating operation is performed upon the under-fill resin layer, so that the under-fill resin layer is hardened. This also will be explained later in detail.

In the above-described second prior art method, however, since an uneven surface of the under-fill resin layer is covered by the semiconductor chip, a large void is generated within the under-fill resin layer, which deteriorates the adhesive characteristics between the semiconductor chip and the interposer substrate.

SUMMARY OF THE INVENTION

It is an object of the present invention to suppress the deterioration of the characteristics of a flip-chip type semiconductor device.

According to the present invention, in a flip-chip type semiconductor device including a semiconductor chip having metal bumps on one surface thereof, an interposer substrate having pad electrodes on one surface thereof, and an under-fill resin layer filled into a gap between the semiconductor chip and the interposer substrate where the metal bumps are in contact with the pad electrodes, the under-fill resin layer has a number of split voids therein.

Also, in a method for manufacturing a flip-chip type semiconductor device, an under-fill resin layer is coated on an interposer substrate having pad electrodes thereon. Next, a semiconductor chip having metal bumps is mounted on the interposer substrate, so that the metal bumps oppose the pad electrodes. In this case, the semiconductor chip is subjected to ultrasonic vibration, after the metal bumps are in contact with the under-fill resin layer and before the metal bumps are in contact with the pad electrodes.

BRIEF DESCRIPTION ON THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiments prior art flip-chip semiconductor devices will be explained with reference to FIGS. 1, 2, 3, 4 and 5.

Figure 1:
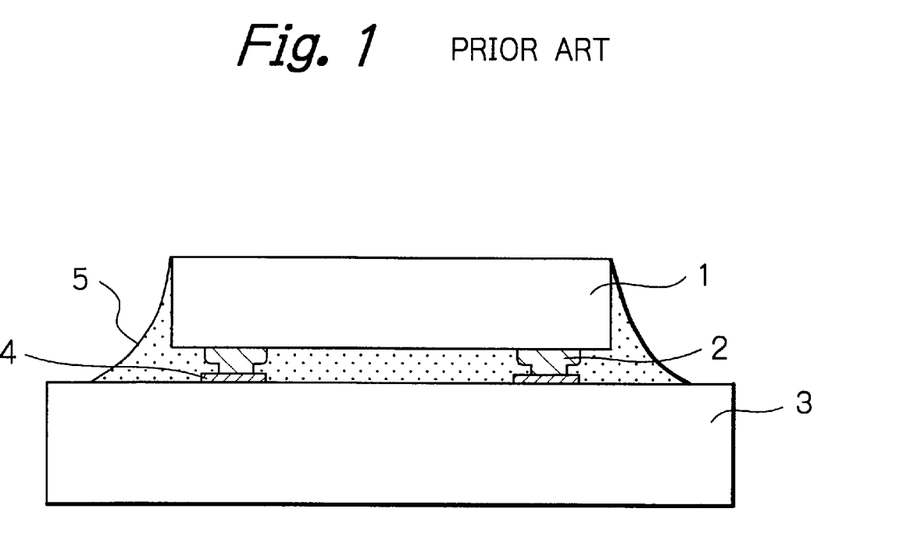
FIG. 1 is a cross-sectional view illustrating a first prior art flip-chip type semiconductor device.

In FIG. 1, which illustrates a first prior art flip-chip type semiconductor device (see JP-A-6-29334), reference numeral 1 designates a flip-chip type semiconductor chip 1 having a large number of metal bumps 2, and 3 designates an interposer substrate having a large number of pad electrodes 4 corresponding to the metal bumps 2. The interposer substrate 3 is made of insulating material such as glass epoxy resin.

In an operation mode, when the semiconductor chip 1 is heated, a shearing strain occurs due to the discrepancy in thermal expansion coefficient between the semiconductor chip 1 and the interposer substrate 3 at the contact portions between the metal bumps 2 and the pad electrodes 4, which would electrically separate the metal bumps 2 from the pad electrodes 4. At worst, the semiconductor chip 1 is cracked to destroy the circuit thereof.

In order to disperse the above-mentioned shearing stress occurring at the contact portions between the metal bumps 2 and the pad electrodes 4, an under-fill resin layer 5 is inserted between the semiconductor chip 1 and the interposer substrate 3. In this case, the under-fill resin layer 5 is made of thermosetting resin where small particles of silica or alumina are dispersed, so that the thermal expansion coefficient of the under-fill resin layer 5 is made an intermediate value between those of the semiconductor chip 1 and the interposer substrate 3. Note that silica or alumina has a good thermal conductivity to improve the dissipation characteristics of the semiconductor chip 1.

Further, if voids are generated within the under-fill resin layer 5, the adhesive characteristics between the semiconductor chip 1 and the interposer substrate 3 are deteriorated. In order to eliminate voids from the under-fill resin layer 5, the interposer substrate 3 is subjected to ultrasonic vibration.

Figure 2:
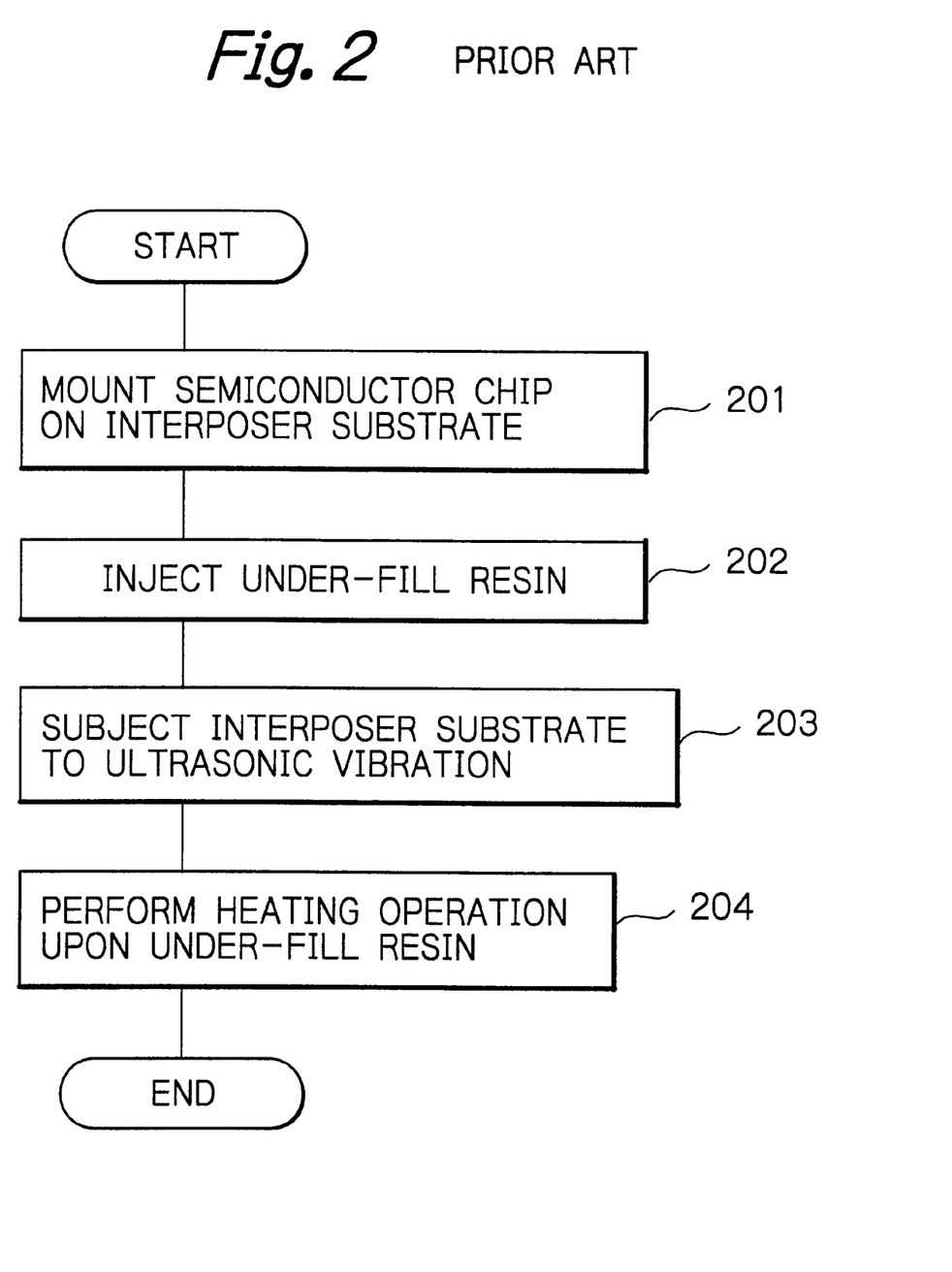
FIG. 2 is a flowchart for explaining a method for manufacturing the flip-chip type semiconductor device of FIG. 1.

The method for manufacturing flip-chip type semiconductor device of FIG. 1 will be explained next with reference to FIG. 2.

First, at step 201, a flip-chip type semiconductor chip 1 having metal bumps 2 is faced down and then, is mounted on an interposer substrate 3 having pad electrodes 4, so that the metal bumps 2 are in contact with respective ones of the pad electrodes 4.

Next, at step 202, thermosetting resin including silica or alumina is injected into a gap between the semiconductor chip 1 and the interposer substrate 3, so that an under-fill resin layer 5 is formed therebetween.

Next, at step 203, the interposer substrate 3 is subjected to ultrasonic vibration, in order to eliminate voids from the under-fill resin layer 5.

Finally, at step 204, a heating operation is performed upon the under-fill resin layer 5, so that the under-fill resin layer 5 is hardened.

In the above-described flip-chip type semiconductor device of FIG. 1, however, since under-fill resin is injected into a gap after such a gap is formed between the semiconductor chip 1 and the interposer substrate 3, it is difficult to completely inject under-fill resin into the gap due to the fact that the gap is very narrow. Note that the height of the metal bumps 2 is about 0.1 mm.

Figure 3:
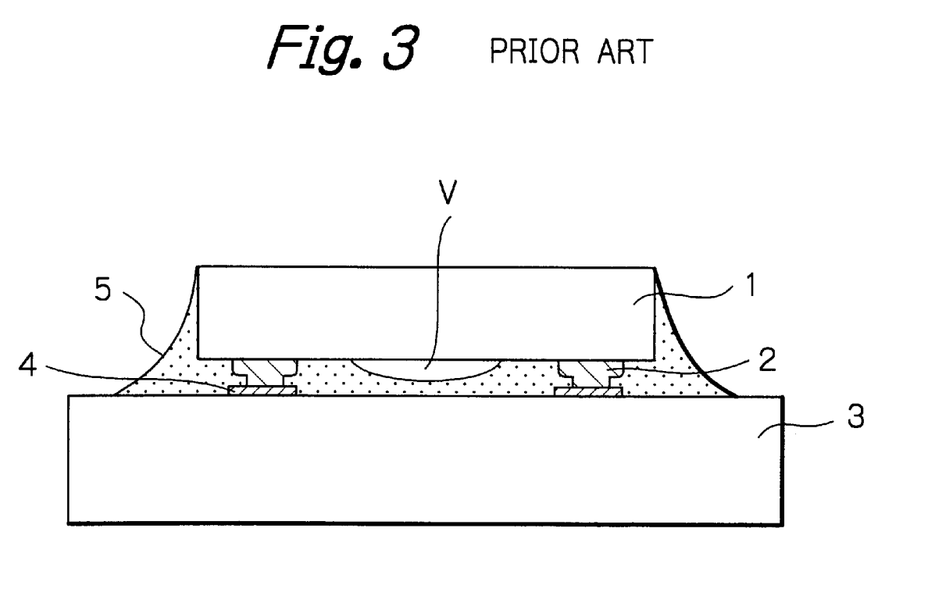
FIG. 3 is a cross-sectional view illustrating a second prior art flip-chip type semiconductor device.

In FIG. 3, which illustrates a second prior art flip-chip type semiconductor device (see: JP-A-10-335373), this flip-chip type semiconductor device has a similar configuration to that of FIG. 1 except for a large void V within the under-fill resin layer 5 due to the manufacturing method thereof.

Figure 4:
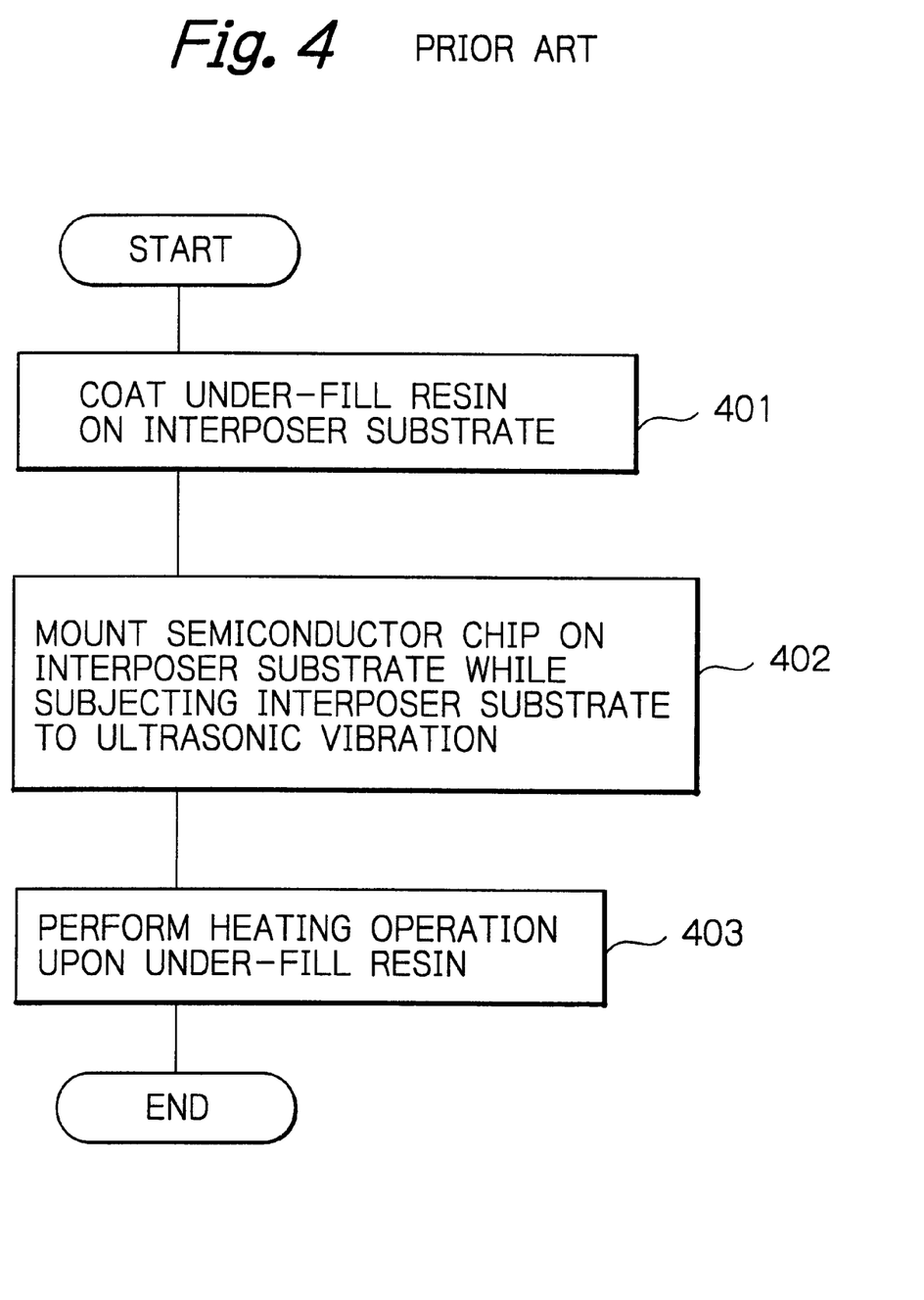
FIG. 4 is a flowchart for explaining a method for manufacturing the flip-chip type semiconductor device of FIG. 3.

The method for manufacturing flip-chip type semiconductor device of FIG. 3 will be explained next with reference to FIG. 4.

First, at step 401, thermosetting resin including silica or alumina is coated on an interposer substrate 3 having pad electrodes 4, so that an under-fill resin layer 5 is formed thereon.

Next, at step 402, a flip-chip type semiconductor chip 1 having metal bumps 2 is faced down and then is mounted on the interposer substrate 3, so that the metal bumps 2 are in contact with respective ones of the pad electrodes 4. Simultaneously, the semiconductor chip 1 is subjected to ultrasonic vibration, so that a solid phase diffusion occurs at the contact portions between the metal bumps 2 and the pad electrodes 4.

Finally, at step 403, a heating operation is performed upon the under-fill resin layer 5, so that the under-fill resin layer 5 is hardened.

Figure 5:
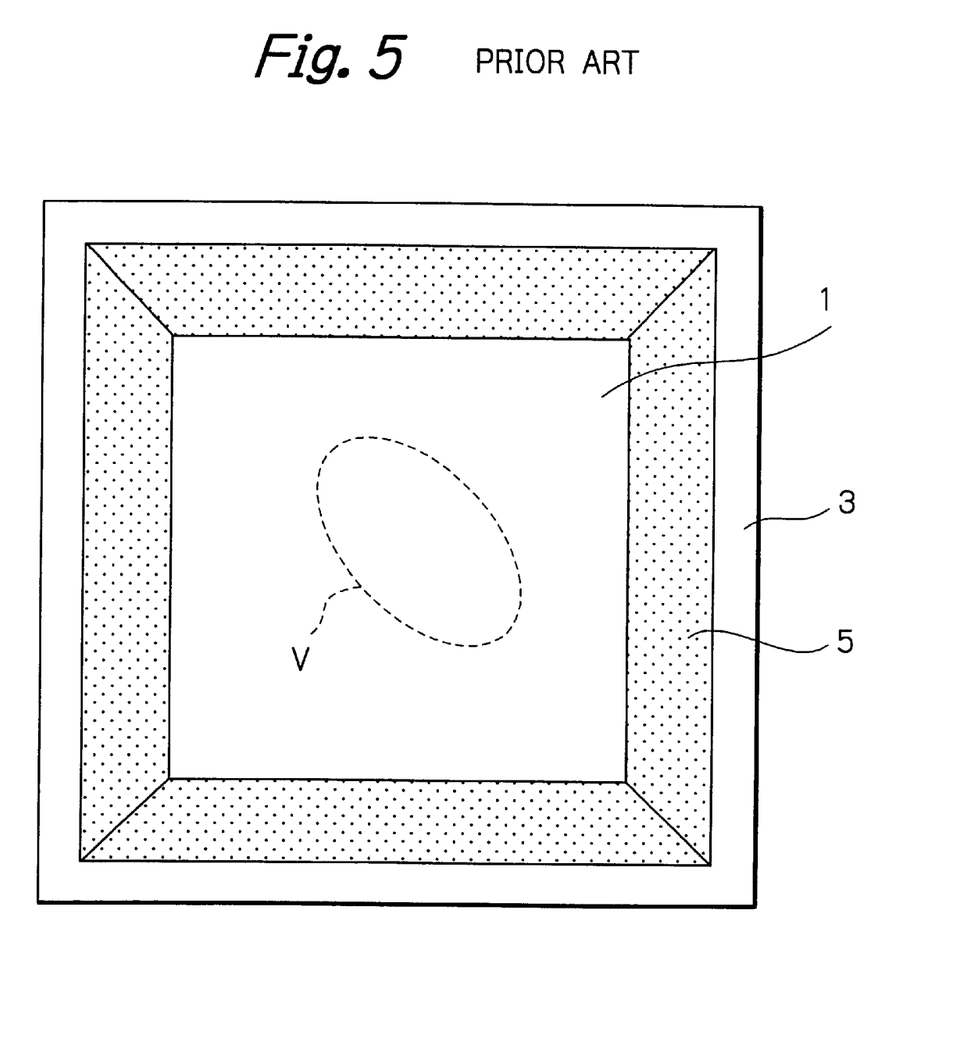
FIG. 5 is a plan view of the flip-chip type semiconductor device of FIG. 3 for explaining the generation of a large void.

In the above-described flip-chip type semiconductor device of FIG. 3, however, since an uneven surface of the under-fill resin layer 5 is covered by the semiconductor chip 1, a large void V is generated within the under-fill resin layer 5 as illustrated in FIG. 5, which deteriorates the adhesive characteristics between the semiconductor chip 1 and the interposer substrate 3.

Note that, after some time, the above-mentioned uneven surface will be flattened due to the viscosity of the under-fill resin layer 5. In this case, however, it will take a longer time to manufacture the flip-chip type semiconductor device of FIG. 3.

Figure 6:
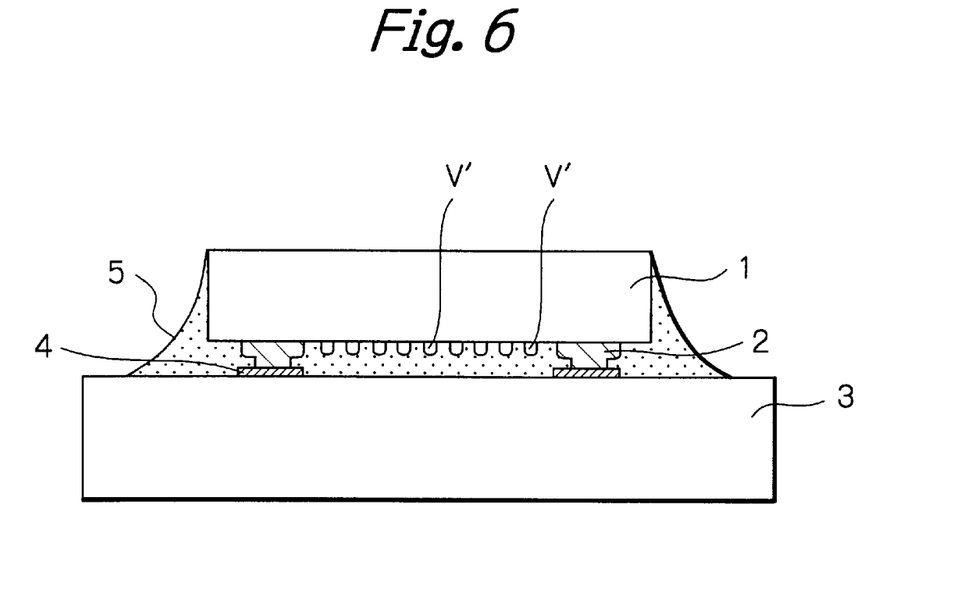
FIG. 6 is a cross-sectional view illustrating an embodiment of the flip-chip type semiconductor device according to the present invention.

In FIG. 6, which illustrates an embodiment of the flip-chip type semiconductor device according to the present invention, this flip-chip type semiconductor device has a similar configuration to that of FIGS. 1 and 3 except for a large number of small voids V' split within the under-fill resin layer 5 due to the manufacturing method thereof. Since each of the split voids V' is very small, the adhesive characteristics between the semiconductor chip 1 and the interposer substrate 3 are not deteriorated. That is, since each of the voids V' has a small area, even when the air within each of the voids V' is heated by the heat of the semiconductor chip 1, the inner pressure within each of the voids V' is not so increased, so that the deterioration of the adhesive characteristics between the semiconductor chip 1 and the interposer substrate 3 is suppressed. In addition, the increased pressure by the thermal expansion of the voids V' is not localized, the deterioration of the adhesive characteristics between the semiconductor chip 1 and the interposer substrate 3 is also suppressed.

The method for manufacturing the flip-chip type semiconductor device of FIG. 6 will be explained next with reference to FIG. 7 as well as FIGS. 8A, 8B, 9A, 9B, 9C and 9D.

Figure 8A:
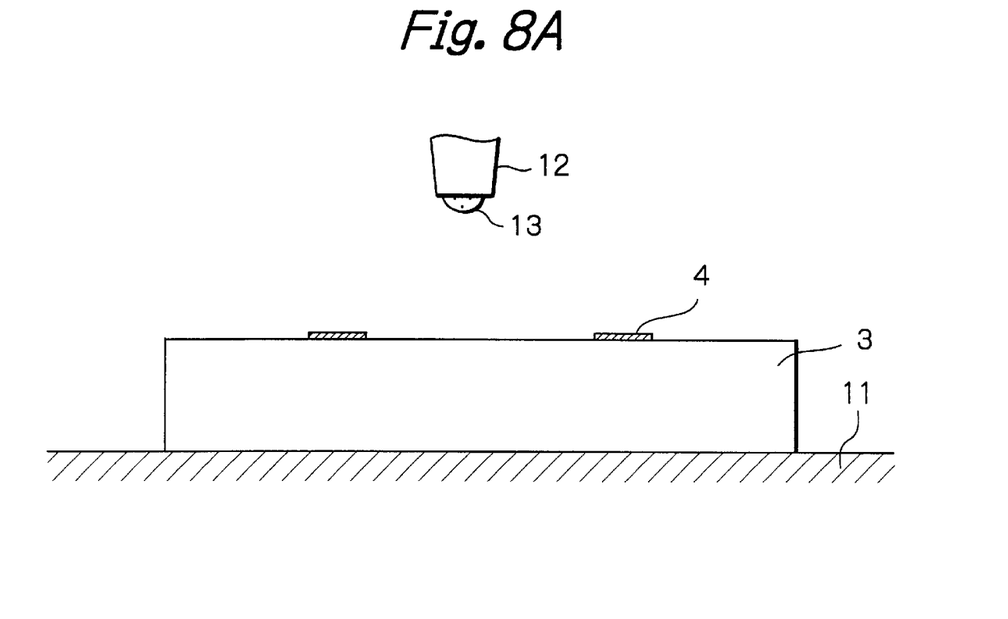
FIGS. 8A, 8B, 9A, 9B, 9C and 9D are diagrams for explaining the flowchart of FIG. 7.
Figure 8B:
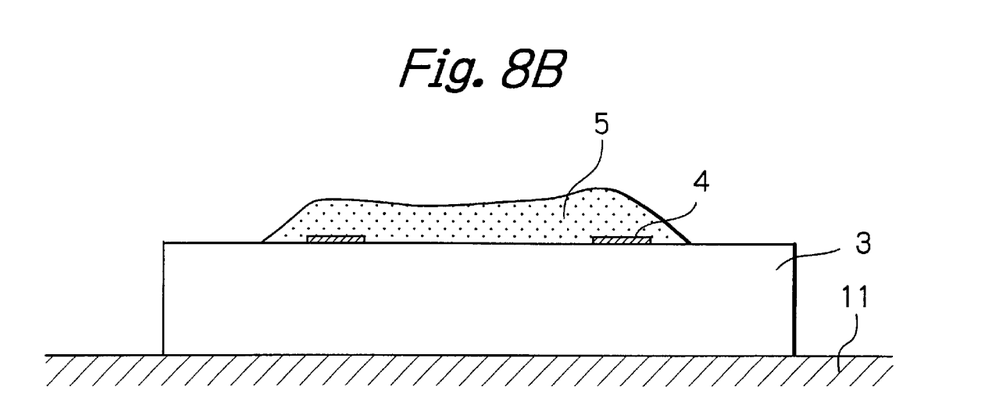

First, at step 701, an interposer substrate 3 having pad electrodes 4 is mounted on a support table 11 as illustrated in FIG. 8A. Note that the support table 11 incorporates a heater (not shown) for heating the interposer substrate 3. Then, as illustrated in FIG. 8A, a syringe 12 ejects thermosetting resin 13. As a result, as illustrated in FIG. 8B, an under-fill resin layer 5 is coated on the interposer substrate 3. Although the surface of the under-fill resin layer 5 is uneven, the surface of the under-fill resin layer 5 will be flattened to a certain extent over time.

Figure 9A:
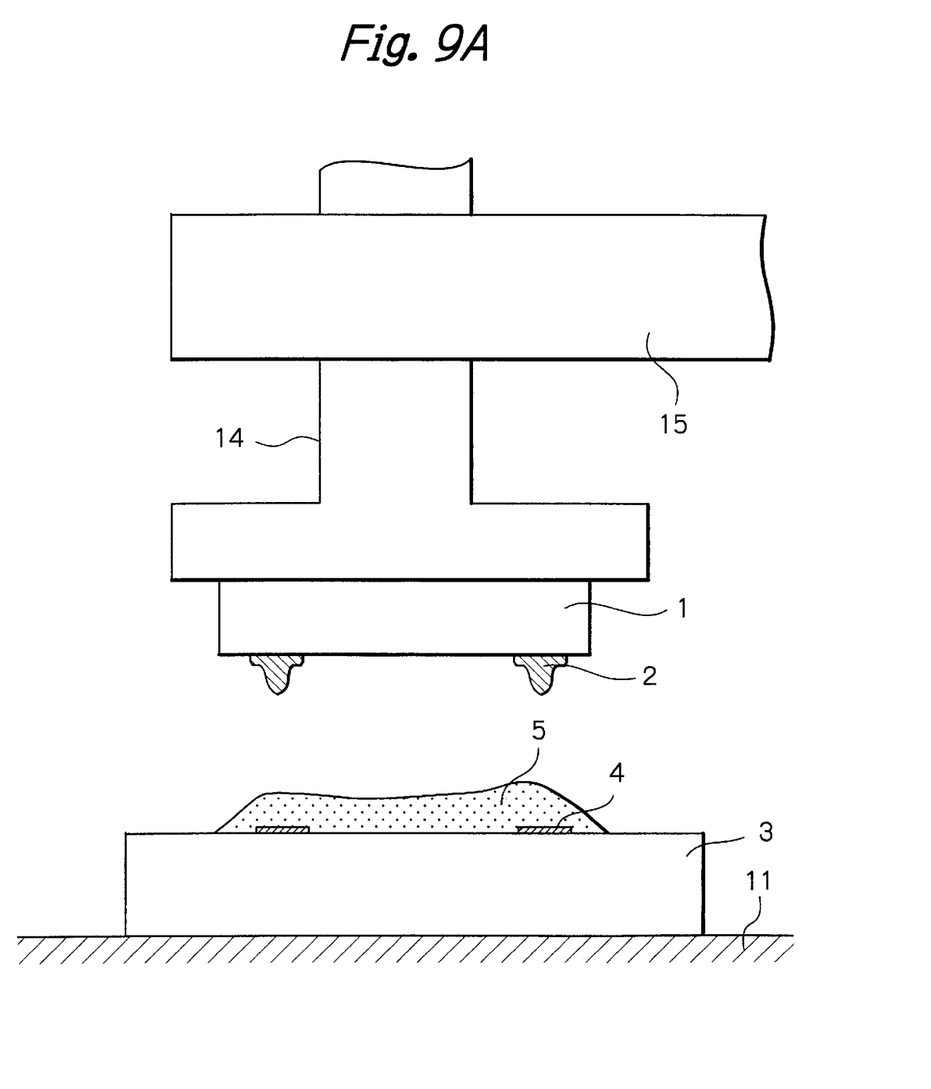
Figure 9B:
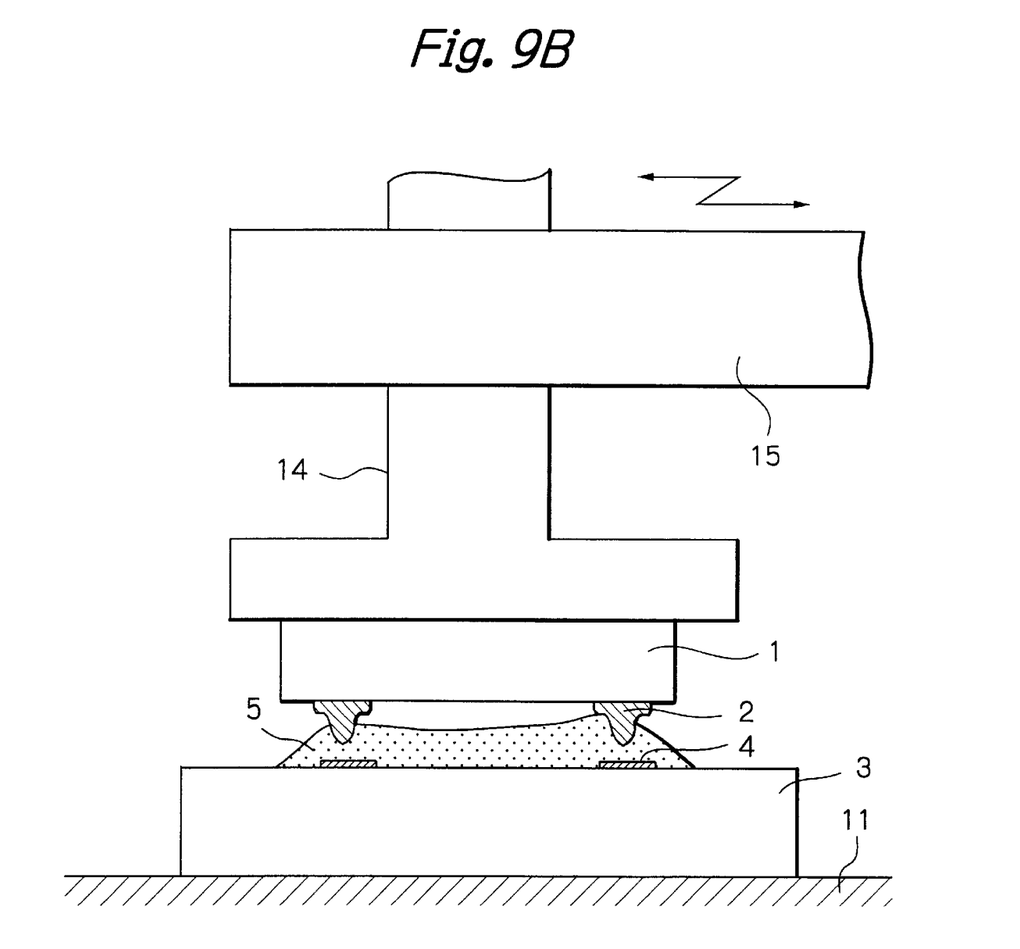
Figure 9C:
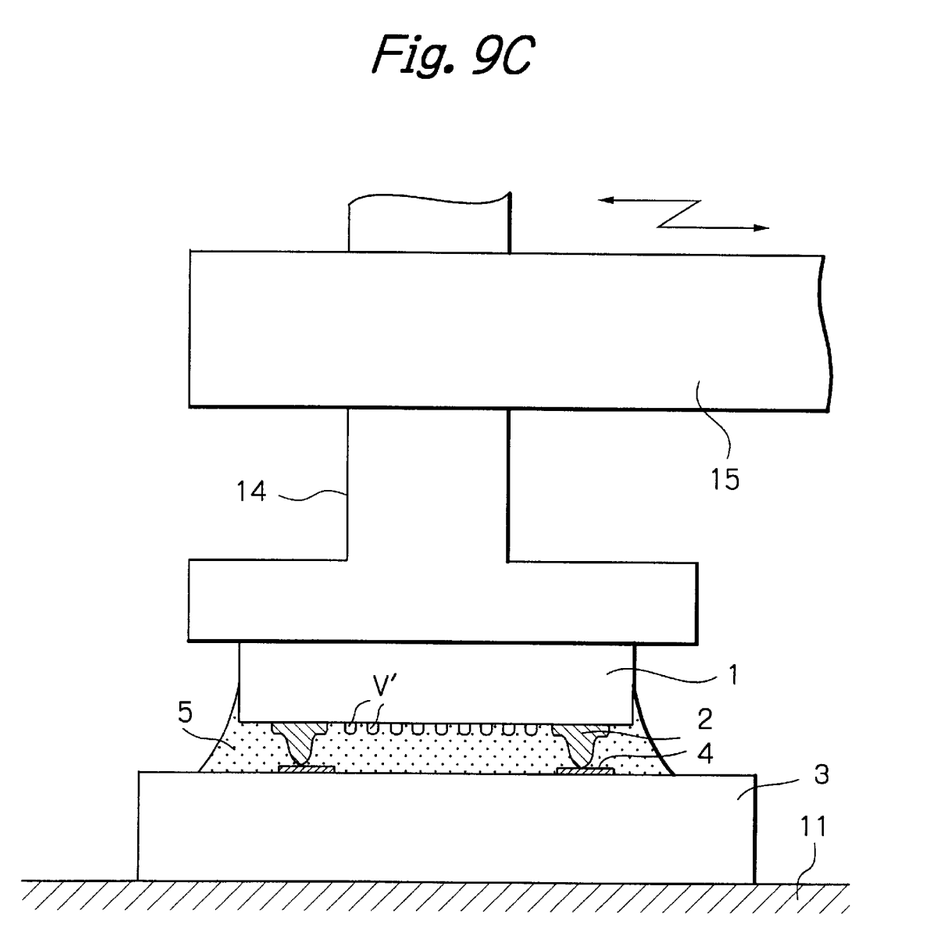

Next, at step 702, a semiconductor chip 1 having metal bumps 2 which have sharp edges for generating ultrasonic vibration is faced down and is mounted on the interposer substrate 3, while the semiconductor chip 1 is subjected to ultrasonic vibration. That is, as illustrated in FIG. 9A, a suction collet 14 fixed at a horn 15 sucks the semiconductor chip 1 and moves the semiconductor chip 1 above the interposer substrate 3. Note that the horn 15 can be moved by a mechanism (not shown) and has an ultrasonic vibrator (not shown) at its end. Also, a video monitor (not shown) is provided to monitor the location of the semiconductor chip 1 relative to the interposer substrate 3. Then, as illustrated in FIG. 9B, when the metal bumps 2 are in contact with the under-fill resin layer 5, i.e., the metal bumps 2 reach the interface of the under-fill resin layer 5, the semiconductor chip 1 is subjected by the ultrasonic vibrator to ultrasonic vibration. As a result, as illustrated in FIG. 9C, the surface of the under-fill resin layer 5 collides with the surface of the semiconductor chip 1, so that a large number of voids V' are generated with the under-fill resin layer 5 before the metal bumps 2 reach the pad electrodes 4. Simultaneously, the under-fill resin layer 5 is spilled out from the gap between the semiconductor chip 1 and the interposer substrate 3. When, the metal bumps 2 are in contact with the pad electrodes 4, the ultrasonic vibration applied to the semiconductor chip 1 is stopped.

Figure 9D:
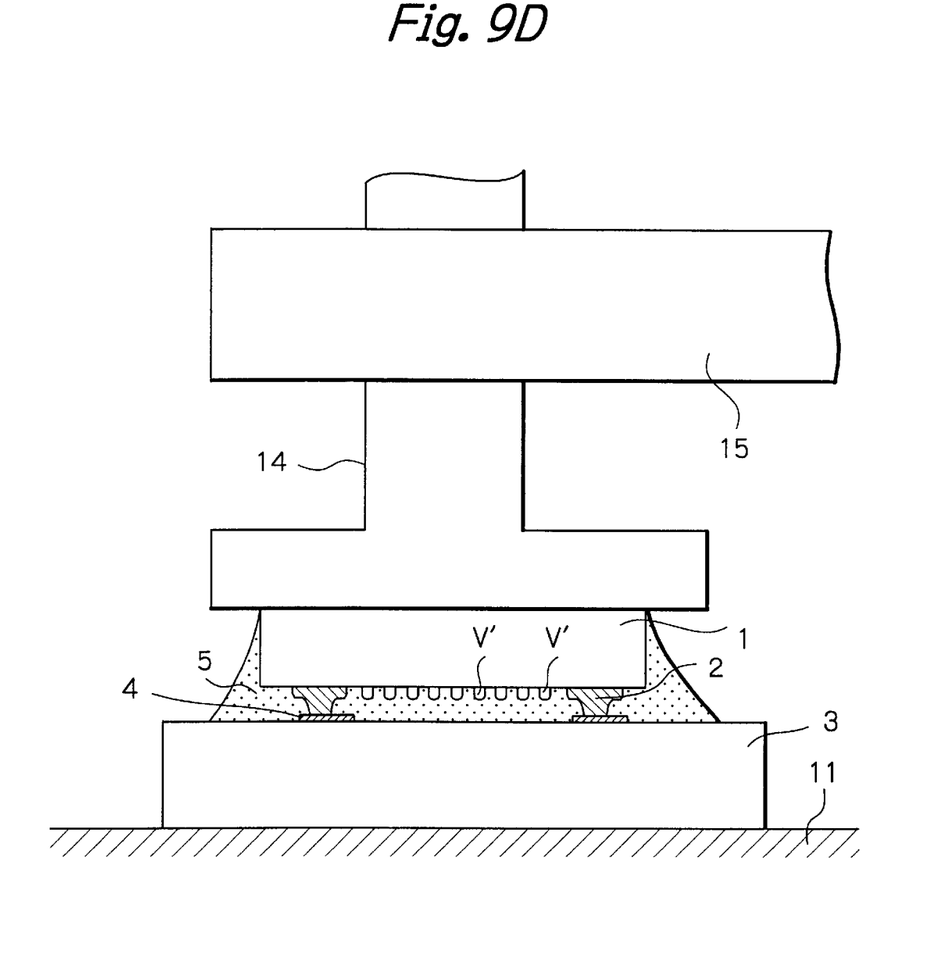

Next, at step 703, the semiconductor chip 1, i.e., the metal bumps 2 are further pushed down, so that the sharp edges of the metal bumps 2 are deformed as illustrated in FIG. 9D. As a result, the metal bumps 2 are surely in contact with the pad electrodes 4.

Finally, at step 704, a heating operation is performed upon by the heater incorporated in the support table 11 the under-fill resin layer 5, so that the under-fill resin layer 5 is hardened.

Figure 7:
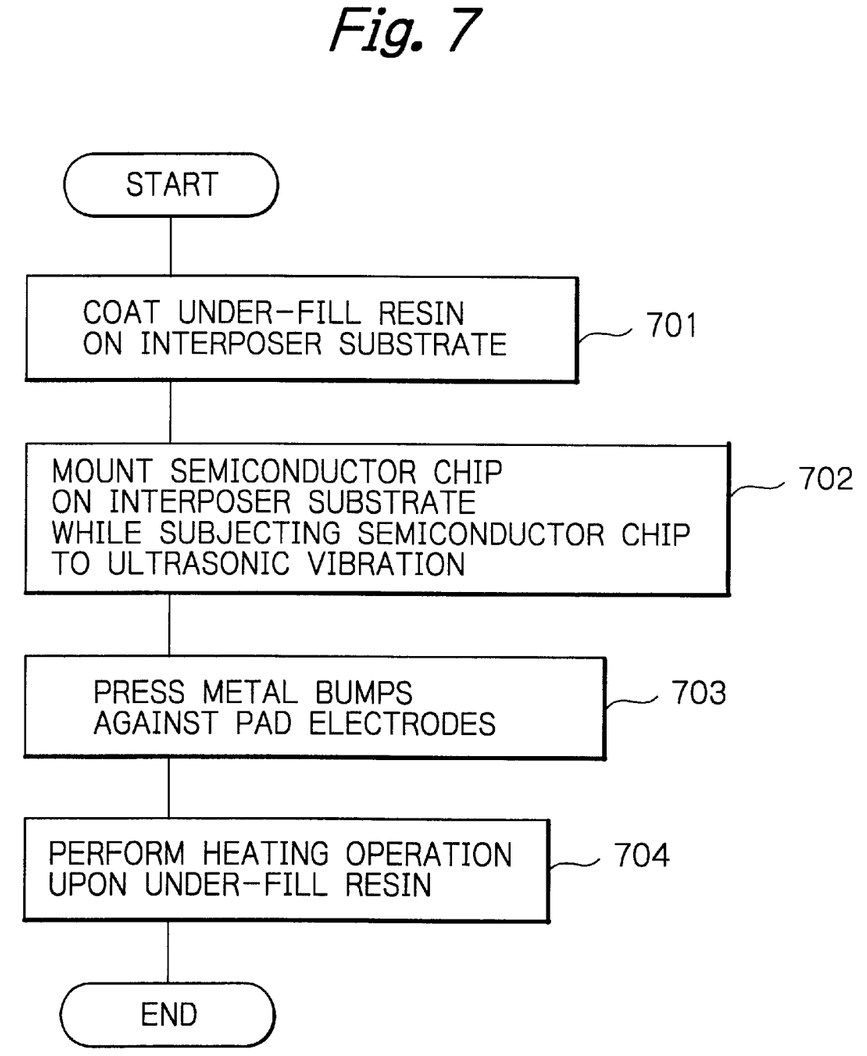
FIG. 7 is a flowchart for explaining a method for manufacturing the flip-clip type semiconductor device of FIG. 6.

In the manufacturing method as shown in FIG. 7, although an ultrasonic vibration is applied to the semiconductor chip 1 immediately before the metal bumps 2 are in contact with the pad electrodes 4, it is possible to generate an ultrasonic vibration only for a short time period to generate a large number of voids V' within the under-fill resin layer 5. On the other hand, it is possible to generate an ultrasonic vibration after the metal bumps 2 are in contact with the pad electrodes 4, even when the heating operation is carried out.

As explained hereinabove, according to the present invention, since each of the split voids is very small, the adhesive characteristics between the semiconductor chip and the interposer substrate would not be deteriorated.

What is claimed is:

1. A method for manufacturing a flip-chip type semiconductor device, comprising the steps of:

coating an under-fill resin layer on an interposer substrate having pad electrodes thereon;

mounting a semiconductor chip having metal bumps on said interposer substrate, so that said metal bumps oppose said pad electrodes; and subjecting said semiconductor chip to ultrasonic vibration after said metal bumps are in contact with said under-fill resin layer and before said metal bumps are in contact with said pad electrodes, wherein said ultrasonic vibration subjecting step further subjects said semiconductor chip to said ultrasonic vibration after said metal bumps are in contact with said pad electrodes.

2. The method as set forth in claim 1, wherein said metal bumps have sharp edges for generating ultrasonic vibration, said method further comprising a step for pressing said semiconductor chip against said interposer substrate after said metal bumps are in contact with said pad electrodes, so that the sharp edges of said metal bumps are deformed.

3. A method for manufacturing a flip-chip type semiconductor device, comprising the steps of:

coating an under-fill resin layer on an interposer substrate having pad electrodes thereon;

mounting a semiconductor chip having metal bumps on said interposer substrate, so that said metal bumps oppose said pad electrodes; and subjecting said semiconductor chip to ultrasonic vibration after said metal bumps are in contact with said under-fill resin layer and before said metal bumps are in contact with said pad electrodes, further comprising a step of performing a heating operation upon said under-fill resin layer after said metal bumps are in contact with said pad electrodes.

4. The method as set forth in claim 3, wherein said ultrasonic vibration subjecting step further subjects said semiconductor chip to said ultrasonic vibration while said heating operation is performed.

5. The method as set forth in claim 3, wherein said metal bumps have sharp edges for generating ultrasonic vibration, said method further comprising a step for pressing said semiconductor chip against said interposer substrate after said metal bumps are in contact with said pad electrodes, so that the sharp edges of said metal bumps are deformed.

* * * * *